(12) United States Patent
Gu et al.

(10) Patent No.: US 6,426,683 B1
(45) Date of Patent: Jul. 30, 2002

(54) INTEGRATED FILTER WITH IMPROVED I/O MATCHING AND METHOD OF FABRICATION

(75) Inventors: Wang-Chang A. Gu, Scottsdale; Richard Stephen Kommrusch, Fountain Hills, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/436,428

(22) Filed: Nov. 9, 1999

(51) Int. Cl.$^7$ ................................................. H03H 7/12
(52) U.S. Cl. ...................... 333/174; 333/193; 333/185; 333/32; 336/200
(58) Field of Search ............................... 333/193, 185, 333/174, 32; 336/83, 200; 455/307

(56) References Cited

U.S. PATENT DOCUMENTS 3,812,442 A * 5/1974 Muckelroy .................... 336/83
5,933,062 A * 8/1999 Kommrusch ................. 333/193
6,115,592 A * 9/2000 Ueda ............................ 455/307

* cited by examiner

Primary Examiner—Justin P. Bettendorf
Assistant Examiner—Dean Takaoka
(74) Attorney, Agent, or Firm—William E. Koch

(57) ABSTRACT

An integrated filter circuit and a method of fabrication are disclosed, wherein the integrated filter has an input and an output parasitic shunt impedance. Input and output electrical components are coupled to the input and output terminals, respectively, to reduce the input and output parasitic shunt impedances. The input and output electrical components each include one of a coil, a section of transmission line, a coil and tuneable capacitance connected in a series tuned circuit, or a coil and tuneable capacitance connected in a parallel tuned circuit. The integrated filter includes input and output multilayer ceramic integrated coils which may be positioned so that capacitive coupling between the coils substantially cancels inductive coupling therebetween, and/or an interlayer gridded ground wall is positioned between the input and output coils

30 Claims, 4 Drawing Sheets

INTEGRATED FILTER WITH IMPROVED I/O MATCHING AND METHOD OF FABRICATION

FIELD OF THE INVENTION

This invention relates to very compact integrated circuits and particularly to integrated filters.

BACKGROUND OF THE INVENTION

A frequency selecting filter serves three important functions, namely, passing electrical signals at a desired frequency, rejecting other frequencies, and matching both source and load impedances. The ongoing trend of miniaturization through integration presents a problem in filter matching circuit design, in which parasitic shunt capacitance prevents the filter from being matched to its source and load, and also presents a problem in filter stopband isolation design, in which the coupling between the filter's input and output (I/O) sections compromises the filter's stopband rejection performance.

In conventional filter design, the parasitic shunt capacitance is small, and its effect on the matching circuit performance is mostly negligible. Also, in conventional filter design, the coupling between a filters I/O sections can be reduced by physically separating these two sections so that the impact on the filter's stopband rejection performance is negligibly small. However, as circuit design moves to highly integrated circuits, such multilayer ceramic integrated circuits (MCIC) or multilayer printed circuit boards (MPCB) and high density interconnects (HDI), the parasitic shunt capacitance adversely affects the matching circuit performance. This is relatively new and challenging problem in modern integrated filter design, and the prior art approach, which is to increase spacing between filter elements and to use ground planes, is not a viable solution in integrated filter design.

BRIEF DESCRIPTION OF THE DRAWINGS

Referring to the drawings.

DESCRIPTION OF THE PREFERRED EMBODIMENT

Figure 1:
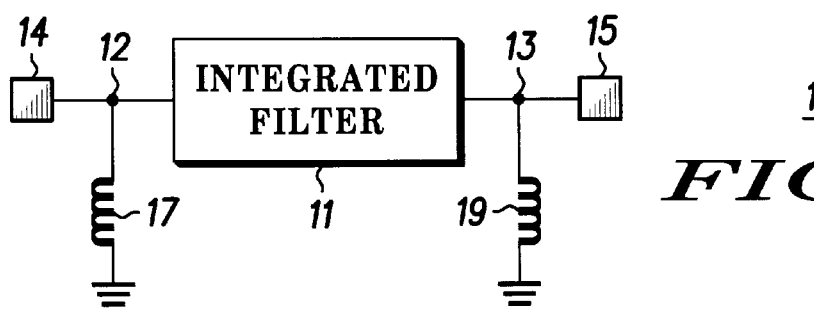
FIGS. 1 through 4 are schematic diagrams of various integrated filter circuits in accordance with the present invention.

Turning now to the figures and specifically to FIG. 1, a schematic diagram is illustrated of an integrated filter circuit 10 with improved Input/Output (I/O) matching in accordance with the present invention. Circuit 10 includes an integrated filter 11 having an input terminal 12 with input parasitic shunt impedance (not shown) and an output terminal 13 with output parasitic shunt impedance (not shown).

Integrated filter 11 is any of the modern highly integrated filters, such as those constructed in accordance with the techniques of multilayer ceramic integrated circuits (MCIC), multilayer printed circuit boards (MPCB) and high density interconnects (HDI), etc., in which the input and output parasitic shunt impedances are inherent and adversely affect the matching circuit performance. As will be understood by those skilled in the art, the input and output parasitic shunt impedances are generally distributed shunt capacitances, but can be either a capacitance, an inductance, a resistance, or any combination of the three, and which appear as a lump or discrete component at the specific terminal. Further, integrated filter 11 is illustrated in this specific embodiment in a simple block form for convenience.

An input circuit 14, which is illustrated in block form for convenience, is coupled to input terminal 12. Input circuit 14 has a specific impedance, hereinafter referred to as the source impedance. Also, an output circuit 15, which is illustrated in block form for convenience, is coupled to output terminal 13. Output circuit 15 has a specific impedance, hereinafter referred to as the load impedance. Input and output parasitic shunt impedances of filter circuit 10 affect the input and output impedances of filter circuit 10. As is understood by those skilled in the art, input circuit 14, filter circuit 10, and output circuit 15 operate most efficiently when the source impedance of input circuit 14 matches the input impedance of filter circuit 10 and the output impedance of filter circuit 109 matches the load impedance of output circuit 15. However, in most instances in which filter circuit 10 is fabricated in accordance with the techniques of multilayer ceramic integrated circuits (MCIC), multilayer printed circuit boards (MPCB) and high density interconnects (HDI), etc., the input and output impedances are altered substantially by input and output parasitic shunt impedances.

An input electrical component, which in this specific embodiment is an inductive coil 17, has one end connected to input terminal 12 of filter 11 and the other end connected to a common potential, such as ground. Inductive coil 17 is, basically, connected in parallel with the input parasitic shunt impedance so as to reduce the input parasitic shunt impedance. Similarly, an output electrical component, which in this specific embodiment is an inductive coil 19, has one end connected to output terminal 13 of filter 11 and the other end connected to a common potential, such as ground. Inductive coil 19 is, basically, connected in parallel with the output parasitic shunt impedance so as to reduce the output parasitic shunt impedance. As will be understood, inductive coils 17 and 19 are most efficient at reducing or canceling input parasitic shunt capacitance and will generally be used in integrated filter circuits in which the input parasitic shunt impedance is a capacitance. Further, input and output inductive coils 17 and 19 can be conveniently integrated into integrated filter circuit 10 as, for example, integrated inductive coils formed in the multilayer ceramic integrated circuit (MCIC), multilayer printed circuit board (MPCB) and high density interconnects (HDI), etc.

Figure 2:
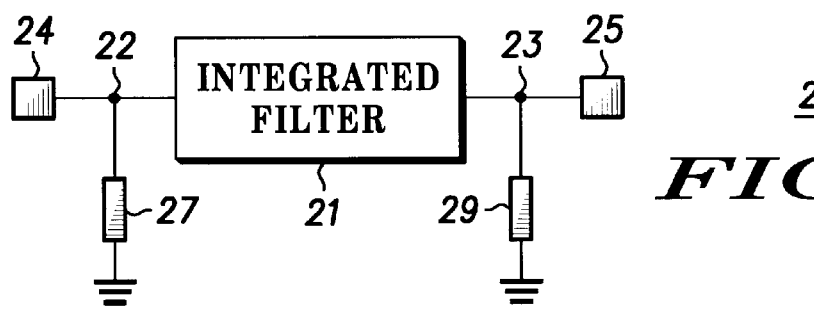

Turning now to FIG. 2, a schematic diagram is illustrated of an integrated filter circuit 20 with improved I/O matching in accordance with the present invention. Circuit 20 includes an integrated filter 21 having an input terminal 22 with input parasitic shunt impedance (not shown) and an output terminal 23 with output parasitic shunt impedance (not shown). As explained above, integrated filter 21 is any of the modern highly integrated filters, in which the input and output parasitic shunt impedances are inherent and adversely affect the matching circuit performance and the input and output parasitic shunt impedances are either a capacitance, an inductance, a resistance, or any combination of the three, and which appear as a lump or discrete component at the specific terminal. Also, integrated filter 21, along with an input circuit 24 and an output circuit 25, are illustrated in this specific embodiment in a simple block form for convenience.

An input electrical component, which in this specific embodiment is a transmission line element 27, has one end connected to input terminal 22 of filter 21 and the other end connected to a common potential, such as ground. Transmission line element 27 is, basically, connected in parallel with the input parasitic shunt impedance so as to reduce the input parasitic shunt impedance. Similarly, an output electrical component, which in this specific embodiment is a transmission line element 29, has one end connected to output terminal 23 of filter 21 and the other end connected to a common potential, such as ground. Transmission line element 29 is, basically, connected in parallel with the output parasitic shunt impedance so as to reduce the output parasitic shunt impedance.

As will be understood, transmission line elements 27 and 29 can be specifically designed with a length which produces inductive or capacitive impedance to reduce or cancel input parasitic shunt inductance and/or capacitance and will generally be used in integrated filter circuits in which the input parasitic shunt impedance is a capacitance or an inductance. Further, input and output transmission line elements 27 and 29 can be conveniently integrated into integrated filter circuit 20 as, for example, by forming in the multilayer ceramic integrated circuit (MCIC), multilayer printed circuit board (MPCB) and high density interconnects (HDI), etc. (HDI), etc.

Figure 3:
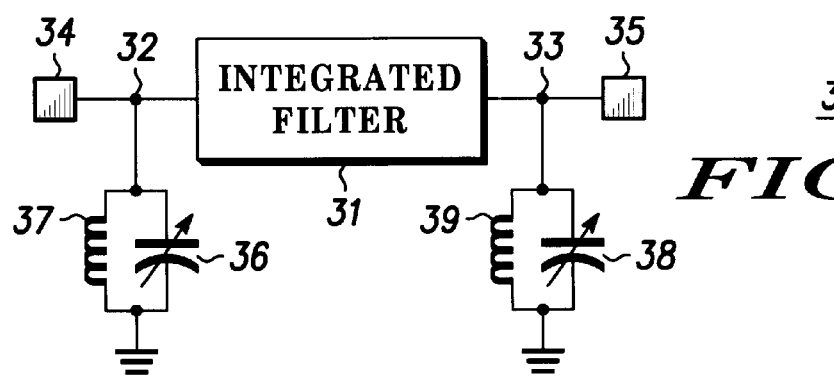

Turning now to FIG. 3, a schematic diagram is illustrated of an integrated filter circuit 30 with improved I/O matching in accordance with the present invention. Circuit 30 includes an integrated filter 31 having an input terminal 32 with input parasitic shunt impedance (not shown) and an output terminal 33 with output parasitic shunt impedance (not shown). As explained above, integrated filter 31 is any of the modern highly integrated filters, in which the input and output parasitic shunt impedances are inherent and adversely affect the matching circuit performance and the input and output parasitic shunt impedances are either a capacitance, an inductance, a resistance, or any combination of the three, and which appear as a lump or discrete component at the specific terminal. Also, integrated filter 31, along with an input circuit 34 and an output circuit 35, are illustrated in this specific embodiment in a simple block form for convenience.

An input electrical component, which in this specific embodiment is a parallel tuned circuit including a variable capacitance 36 and an inductive coil 37, has one end connected to input terminal 32 of filter 31 and the other end connected to a common potential, such as ground. The parallel tuned circuit is, basically, connected in parallel with the input parasitic shunt impedance so as to reduce the input parasitic shunt impedance. Similarly, an output electrical component, which in this specific embodiment is a parallel tuned circuit including a variable capacitance 38 and an inductive coil 39, has one end connected to output terminal 33 of filter 31 and the other end connected to a common potential, such as ground. The parallel tuned circuit is, basically, connected in parallel with the output parasitic shunt impedance so as to reduce the output parasitic shunt impedance.

Figure 4:
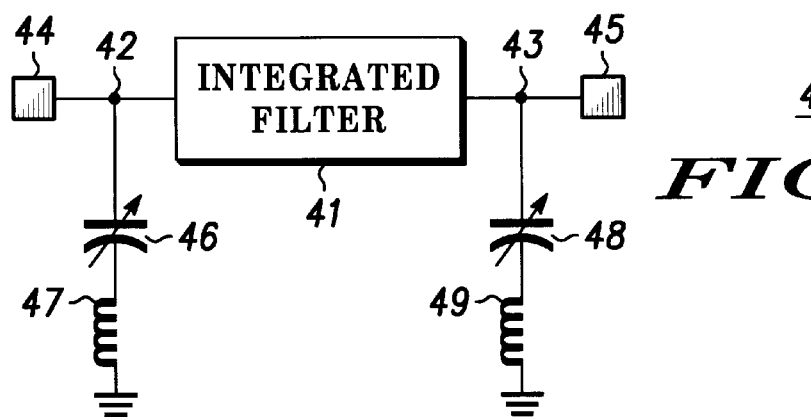

Referring to FIG. 4, a schematic diagram is illustrated or an integrated filter circuit 40 with improved I/O matching in accordance with the present invention. Circuit 40 includes an integrated filter 41 having an input terminal 42 with input parasitic shunt impedance (not shown) and an output terminal 43 with output parasitic shunt impedance (not shown). Also, integrated filter 41, along with an input circuit 44 and an output circuit 45, are illustrated in this specific embodiment in a simple block form for convenience. An input electrical component, which in this specific embodiment is a series tuned circuit including a variable capacitance 46 and an inductive coil 47, has one end connected to input terminal 42 of filter 41 and the other end connected to a common potential, such as ground. Similarly, an output electrical component, which in this specific embodiment is a series tuned circuit including a variable capacitance 48 and an inductive coil 49, has one end connected to output terminal 43 of filter 41 and the other end connected to a common potential, such as ground. The input and output series tuned circuits are, basically, connected in parallel with the input and output parasitic shunt impedances, respectively, so as to reduce the output parasitic shunt impedance.

Here it should be noted that the input and output parallel and series tuned circuits could be tuned by varying either or both of the capacitances and the inductive coils. However, it is preferrable to use a variable capacitor since electronic devices such as varactors or voltage variable capacitors (VVC) can be used as the variable capacitors and are easy to integrate into the circuit. Also, varactors or VVCs can be tuned or varied by simply applying an appropriate voltage thereto. Generally, the parallel and series tuned circuits can be tuned to reduce the input and output parasitic shunt impedances, whether inductive, capacitive, and/or resistive and, consequently, offer more design flexibility which leads to better performance.

Figure 5:
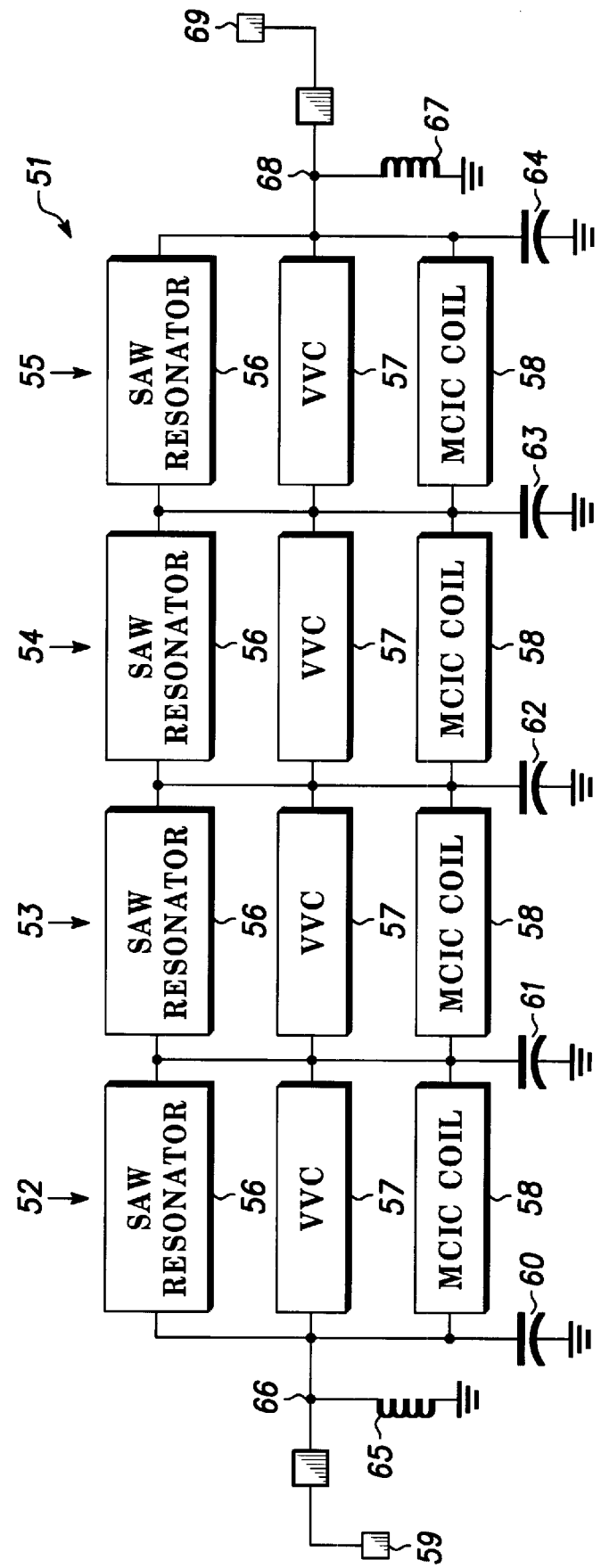
FIG. 5 is a schematic diagram of a tunable transmit integrated filter circuit of a duplexer, implemented in multilayer ceramic integrated circuit (MCIC), in accordance with the present invention.

Turning now to FIG. 5, a schematic diagram is illustrated of a tunable transmit integrated filter circuit 50 of a duplexer, implemented in multilayer ceramic integrated circuit (MCIC), in accordance with the present invention. Filter circuit 50 includes an integrated filter, generally designated 51, including four series connected sections 52, 53, 54, and 55. Each section 52 through 55 includes a surface acoustic wave (SAW) resonator 56, a voltage variable capacitor 57, and an inductive coil 58 formed in the multilayer ceramics. Integrated filter 51 is implemented in MCIC for performance, size, and cost considerations. However, due to the compact implementation, the coupling between the I/Os of adjacent filter sections is inevitable, and this coupling can be capacitive, inductive, or both. Further, the stopband rejection of filter 51 suffers significantly for only very little coupling, e.g. 0.1 pF (capacitance) and 1.0 nH (inductance).

In this specific example, SAW resonators 56 are capacitively coupled with capacitances 61, 62, and 63. Stray or parasitic capacitances may occur as 60 through 64 and are illustrated as a lump component. Generally, intersection parasitic capacitances 61, 62, and 63 can be absorbed into the design of integrated filter 51, but input parasitic capacitance 60 and output parasitic capacitance 64 cannot be absorbed into the design. Input parasitic capacitance 60 and output parasitic capacitance 64 are each about 0.5 pF and result in a return loss to integrated filter 51 of only 7 dB at the beginning of the passband. This performance is clearly not acceptable.

An input electrical component 65, which in this specific embodiment is an inductive coil but which may be any of an inductive coil, a section of transmission line, a series tuned circuit, and a parallel tuned circuit, has one end connected to an input terminal 66 of filter circuit 50 and the other end connected to a common potential, such as ground. Similarly, an output electrical component 67, which in this specific embodiment is an inductive coil but which may be any one of an inductive coil, a section of transmission line, a series tuned circuit, and a parallel tuned circuit, has one end connected to an output terminal 68 of filter circuit 50 and the other end connected to a common potential, such as ground. The input and output electrical components 65 and 67 are connected in parallel with the input and output parasitic shunt capacitances 60 and 64, respectively, so as to reduce the input and output parasitic shunt capacitances. As a result of the incorporation of input and output electrical components 65 and 67, the return loss of filter circuit 50 is improved to at leaast 16 dB within the passband. Here it should be noted that, if needed, additional electrical components, similar to those described above, can be used to reduce parasitic shunt capacitances (or other parasitic shunt elements). An input terminal 59, which is illustrated in block form for convenience, is coupled to input terminal 66. An output terminal 69 which is illustrated in block form for convenience, is coupled to output terminal 68.

Figure 6:
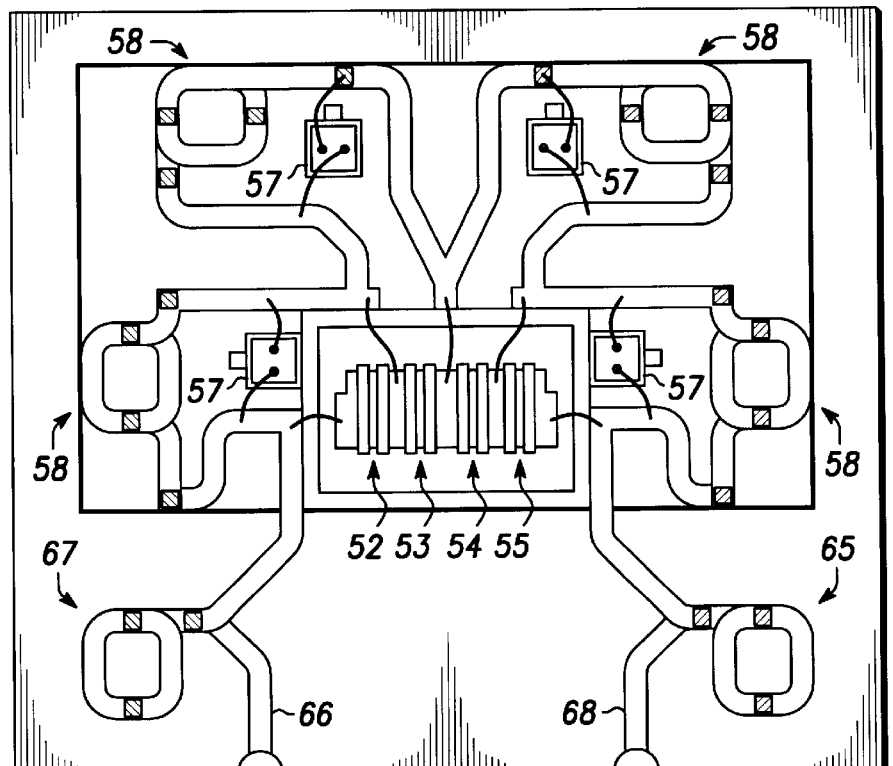
FIG. 6 illustrates in top plan, a layout of the tunable transmit integrated filter circuit of FIG. 5 with the I/O coils separated only by allowable distance in the MCIC package.

Turning now to FIG. 6, a layout of the tunable transmit integrated filter circuit of FIG. 5 is illustrated. For convenience of understanding, similar components are designated with similar numbers. In particular, it should be noted that input and output electrical components 65 and 67, which in this specific embodiment are input and output inductive coils, can be physically separated only by an allowable distance, i.e. the width of the MCIC package. However, the amount of decoupling that can be achieved through physical separation is very limited and can result in defeating the purpose of the integrated circuit implementation or inadequate decoupling. For example, the maximum allowable physical separation illustrated in FIG. 6 still provides coupling between input and output electrical components 65 and 67, which results in the stopband rejection of filter circuit 50 being only 26 dB, which is by no means acceptable.

Figure 7:
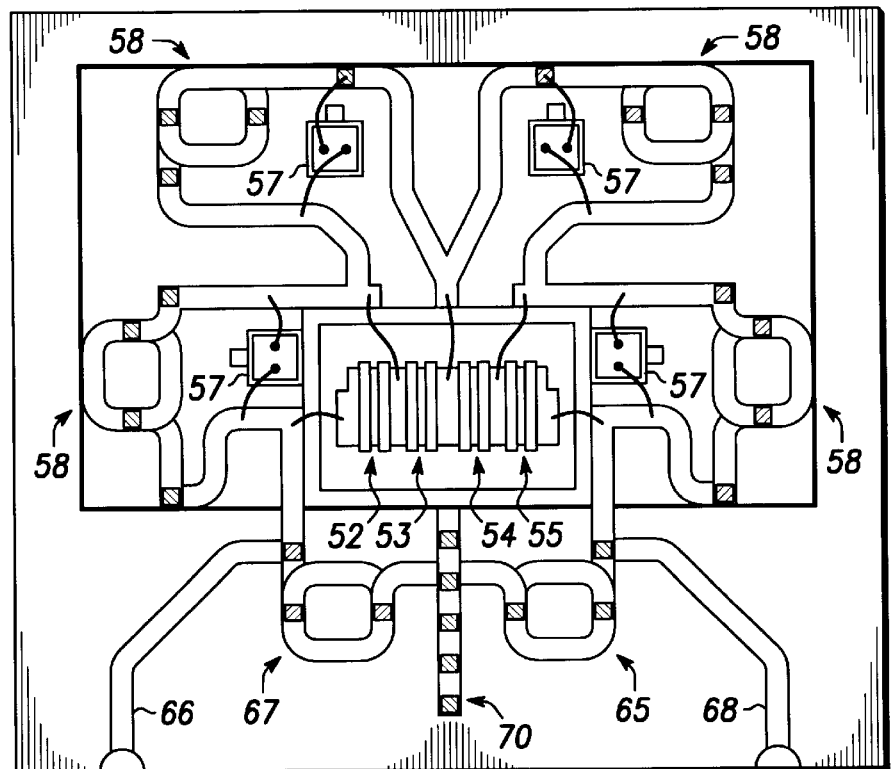
FIG. 7 illustrates in top plan, a layout of the tunable transmit integrated filter circuit of FIG. 5 with the I/O coils separated in accordance with the present invention.

Turning now to FIG. 7, a layout is illustrated of the tunable transmit integrated filter circuit of FIG. 5 in accordance with the present invention. For convenience of understanding, similar components are again designated with similar numbers. In particular, it should be noted that input and output electrical components 65 and 67 in this specific embodiment are input and output inductive coils, which are hereafter designated 65 and 67, respectively. Two different methods and apparatus are used in the structure of FIG. 7 to provide the amount of decoupling required between input and output inductive coils 65 and 67. While these two methods and apparatus are explained separately for convenience in understanding, it should be understood that they may be used separately or together as needed in each application.

In a first method, it should be understood that the magnetic fields of input and output inductive coils 65 and 67 can be arranged to create either a constructive or a destructive coupling. When the spacing of the magnetically coupled coils is then adjusted, the capacitive coupling can be thus adjusted to cancel the inductive coupling at stopband frequencies with a net result of a virtual ground between input and output inductive coils 65 and 67. This adjustment is substantially different than physically spacing the coils to reduce any kind of coupling and can result in the coils being significantly closer together. Much improved stopband performance can be obtained using this method.

Figure 8:
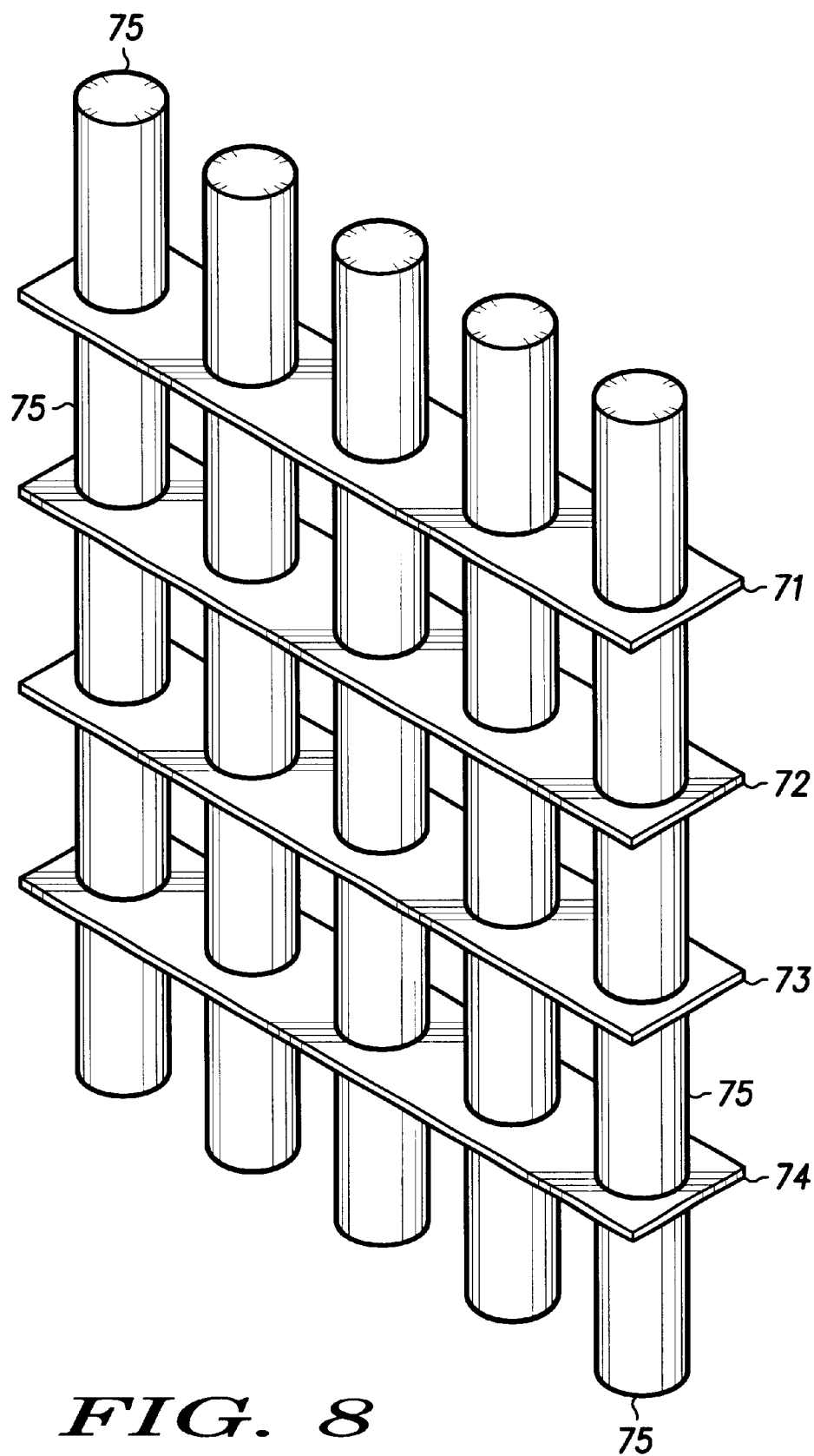
FIG. 8 is an enlarged isometric view of a gridded ground wall in accordance with the present invention.

In a second method and apparatus (illustrated specifically in FIG. 7), input and output inductive coils 65 and 67 are positioned substantially adjacent each other and a gridded ground wall 70 is positioned therebetween. Gridded ground wall 70 is formed in the MCIC package and is attached to a common potential, such as ground, so as to substantially stop electromagnetic coupling between input and output inductive coils 65 and 67. As illustrated in FIG. 8, a printed metal trace 71, 72, 73, 74, etc. is formed on each layer of the MCIC or MPCB and vias 75 are formed as interconnections. Thus, at least one of the printed metal traces 71, 72, 73, 74, etc. are connected directly to ground and vias 75 connect all of the remaining printed metal traces to ground. It is important to note that the traces and vias or posts provide a grid or gridded wall that is specifically designed to stop electromagnetic coupling. For example, the openings in the gridded wall are less than approximately ½0th of a wavelength of the operating frequency. In the embodiment illustrated in FIG. 7, for example, in spite of input and output inductive coils 65 and 67 being placed much closer together than in FIG. 6, a stopband rejection of 46 dB was achieved.

Thus, an integrated filter circuit with improved I/O matching has been disclosed. The integrated filter circuit includes electrical components for cancelling parasitic shunt impedances so that filter performance is greatly improved. Further, coupling between the filter's input and output sections compromises the filter's stopband rejection performance. Two different methods and apparatus are described to improve a filter's stopband isolation, which methods and apparatus include either electrically isolating the filter's I/O sections with a gridded ground wall or electromagnetically cancelling the coupling between the I/O sections. In specific applications it may be possible or convenient to provided limited embodiments of both.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated filter circuit with improved I/O matching comprising:

an integrated filter having an input terminal with input parasitic shunt impedance and an output terminal with output parasitic shunt impedance;

an input electrical component coupled to the input terminal so as to reduce the input parasitic shunt impedance;

an output electrical component coupled to the output terminal so as to reduce the output parasitic shunt impedance; and an interlayer gridded ground wall positioned between the input electrical component and the output electrical component to reduce intercoupling.

2. An integrated filter circuit with improved I/O matching as claimed in claim 1 wherein the input and output electrical components are integrated into the integrated filter circuit.

3. An integrated filter circuit with improved I/O matching as claimed in claim 1 wherein the input and output electrical components each include one of an inductive coil, a section of transmission line, an inductive coil and tunable capacitance connected in a series tuned circuit, and an inductive coil and tunable capacitance connected in a parallel tuned circuit.

4. An integrated filter circuit with improved I/O matching as claimed in claim 1 wherein the integrated filter includes a plurality of filter sections.

5. An integrated filter circuit with improved I/O matching as claimed in claim 4 wherein the plurality of filter sections each include a surface acoustic wave resonator, a voltage variable capacitor, and a multilayer ceramic integrated coil.

6. An integrated filter circuit with improved I/O matching as claimed in claim 4 wherein the plurality of filter sections each include an intermediate parasitic shunt impedance between adjacent coupled sections and the integrated filter circuit further includes an intermediate electrical component coupled to the adjacent coupled sections so as to reduce the intermediate parasitic shunt impedance.

7. An integrated filter circuit with improved I/O matching comprising:
an integrated filter having an input impedance at an input terminal and an output impedance at an output terminal;
an input circuit having a source impedance coupled to the input terminal;
an output circuit having a load impedance coupled to the output terminal;
an input electrical component coupled to the input terminal so as to match the source impedance of the input circuit to the input impedance of the integrated filter at the input terminal;
an output electrical component coupled to the output terminal so as to match the load impedance of the output circuit to the output impedance of the integrated circuit at the output terminal; and
an interlayer gridded ground wall positioned between the input electrical component and the output electrical component to reduce intercoupling.

8. An integrated filter circuit with improved I/O matching as claimed in claim 7 wherein the input impedance and output impedance both include parasitic capacitance.

9. An integrated filter circuit with improved I/O matching as claimed in claim 7 wherein the input and output electrical components are integrated into the integrated filter circuit.

10. An integrated filter circuit with improved I/O matching as claimed in claim 7 wherein the input and output electrical components each include one of an inductive coil, a section of transmission line, an inductive coil and tunable capacitance connected in a series tuned circuit, and an inductive coil and tunable capacitance connected in a parallel tuned circuit.

11. An integrated filter circuit with improved I/O matching as claimed in claim 7 wherein the integrated filter includes a plurality of filter sections.

12. An integrated filter circuit with improved I/O matching as claimed in claim 11 wherein the plurality of filter sections each include a surface acoustic wave resonator, a voltage variable capacitor, and a multilayer ceramic integrated coil.

13. An integrated filter circuit with improved I/O matching as claimed in claim 11 wherein the plurality of filter sections each include an intermediate parasitic shunt impedance between adjacent coupled sections and the integrated filter circuit further includes an intermediate electrical component coupled to the adjacent coupled sections so as to reduce the intermediate parasitic shunt impedance.

14. An integrated filter circuit with improved I/O matching comprising:
an integrated filter including a plurality of multilayer ceramic integrated sections connected in series with an input multilayer ceramic integrated coil and an output multilayer ceramic integrated coil, the input and output multilayer ceramic integrated coils being positioned adjacent each other; and
an interlayer gridded ground wall positioned between the input and output multilayer ceramic integrated coils to reduce intercoupling.

15. An integrated filter circuit with improved I/O matching as claimed in claim 14 wherein the plurality of multilayer ceramic integrated sections of the integrated filter each include a surface acoustic wave resonator, a voltage variable capacitor, and a multilayer ceramic integrated coil.

16. An integrated filter circuit with improved I/O matching as claimed in claim 14 wherein the input and output multilayer ceramic integrated coils are positioned so that capacitive coupling between the input and output multilayer ceramic integrated coils substantially cancels inductive coupling between the input and output multilayer ceramic integrated coils.

17. An integrated filter circuit with improved I/O matching as claimed in claim 14 wherein the input multilayer ceramic integrated coil has an input impedance and the output multilayer ceramic integrated coil has an output impedance, and the integrated filter circuit further includes an input electrical component coupled to the input multilayer ceramic integrated coil so as to match the input impedance to an input circuit and an output electrical component coupled to the output multilayer ceramic integrated coil so as to match the output impedance to an output circuit.

18. An integrated filter circuit with improved I/O matching comprising:
an integrated filter including a plurality of multilayer ceramic integrated sections connected in series with an input multilayer ceramic integrated coil and an output multilayer ceramic integrated coil, the input and output multilayer ceramic integrated coils being positioned adjacent each other;
an interlayer gridded ground wall positioned between the input and output multilayer ceramic integrated coils;
the input and output multilayer ceramic integrated coils being positioned so that capacitive coupling between the input and output multilayer ceramic integrated coils substantially cancels inductive coupling between the input and output multilayer ceramic integrated coils.

19. An integrated filter circuit with improved I/O matching as claimed in claim 18 wherein the input multilayer ceramic integrated coil has an input impedance and the output multilayer ceramic integrated coil has an output impedance, and the integrated filter circuit further includes an input electrical component coupled to the input multilayer ceramic integrated coil so as to match the input impedance to an input circuit and an output electrical component coupled to the output multilayer ceramic integrated coil so as to match the output impedance to an output circuit.

20. An integrated filter circuit with improved I/O matching as claimed in claim 19 wherein the plurality of multilayer ceramic integrated sections of the integrated filter each include a surface acoustic wave resonator, a voltage variable capacitor, and a multilayer ceramic integrated coil.

21. A method of fabricating an integrated filter circuit with improved I/O matching comprising the steps of:
forming an integrated filter having an input multilayer ceramic integrated coil and output multilayer ceramic integrated coil;
positioning the input and output multilayer ceramic integrated coils so that capacitive coupling between the input and output multilayer ceramic integrated coils substantially cancels inductive coupling between the input and output multilayer ceramic intergrated coils; and
positioning an interlayer gridded ground wall between the input and output multilayer ceramic integrated coils to reduce intercouplling.

22. A method of fabricating an integrated filter circuit with improved I/O matching comprising the steps of:
- forming an integrated filter having an input terminal with input parasitic shunt impedance and an output terminal with output parasitic shunt impedance;
- forming an input electrical component coupled to the input terminal so as to reduce the output parasitic shunt impedance;
- forming an output electrical component coupled to the output terminal so as to reduce the output parasitic shunt impedance; and
- positioning an interlayer gridded ground wall between the input electrical component and the output electrical component to reduce intercoupling.

23. A method of fabricating an integrated filter circuit with improved I/O matching as claimed in claim 22 wherein the step of forming the integrated filter includes forming a plurality of filter sections connected in series, each of the plurality of filter sections including a surface acoustic wave resonator, a voltage variable capacitor, and a multilayer ceramic integrated coil.

24. A method of fabricating an integrated filter circuit with improved I/O matching as claimed in claim 23 wherein the step of forming a plurality of filter sections includes forming each section with an intermediate parasitic shunt impedance between adjacent coupled sections and forming an intermediate electrical component coupled to the adjacent coupled sections so as to reduce the intermediate parasitic shunt impedance.

25. A method of fabricating an integrated filter circuit with improved I/O matching as claimed in claim 22 wherein the steps of forming the input electrical component and forming the output electrical component include integrating the input and output electrical components into the integrated filter circuit.

26. A method of fabricating an integrated filter circuit with improved I/O matching as claimed in claim 22 wherein the steps of forming the input electrical component and forming the output electrical component each include forming the input and output electrical components with one of an inductive coil, a section of transmission line, an inductive coil and tuneable capacitance connected in a series tuned circuit, and an inductive coil and tuneable capacitance connected in a parallel tuned circuit.

27. A method of fabricating an integrated filter circuit with improved I/O matching comprising the steps of:
- forming an integrated filter including a plurality of multilayer ceramic integrated sections connected in series with an input multilayer ceramic integrated coil and an output multilayer ceramic integrated coil, positioning the input and output multilayer ceramic integrated coils adjacent each other; and
- forming an interlayer gridded ground wall between the input and output multilayer ceramic integrated coils to reduce intercoupling.

28. A method of fabricating an integrated filter circuit with improved I/O matching as claimed in claim 27 wherein the step of forming the integrated filter including the plurality of multilayer ceramic integrated sections includes forming each of the plurality of multilayer ceramic integrated sections with a surface acoustic wave resonator, a voltage variable capacitor, and a multilayer ceramic integrated coil.

29. A method of fabricating an integrated filter circuit with improved I/O matching as claimed in claim 28 wherein the step of forming the integrated filter with the input multilayer ceramic integrated coil and the output multilayer ceramic integrated coil includes positioning the input and output multilayer ceramic integrated coils so that capacitive coupling between the input and output multilayer ceramic integrated coils substantially cancels inductive coupling between the input and output multilayer ceramic integrated coils.

30. A method of fabricating an integrated filter circuit with improved I/O matching as claimed in claim 29 wherein the step of forming the integrated filter includes forming the input multilayer ceramic integrated coil with an input impedance and the output multilayer ceramic integrated coil with an output impedance, and the method further includes a step of coupling an input electrical component to the input multilayer ceramic integrated coil so as to match the input impedance to an input circuit and coupling an output electrical component to the output multilayer ceramic integrated coil so as to match the output impedance to an output circuit.

* * * * *